United States Patent [19]

Eisele

[11] 4,302,767

[45] Nov. 24, 1981

[54] CONTROLLED POWER-SEMICONDUCTOR COMPONENT HAVING AN ANNULAR CAGE

[75] Inventor: Dieter Eisele, Lampertheim, Fed. Rep. of Germany

[73] Assignee: Brown, Boveri & Cie Aktiengesellschaft, Mannheim-Käfertal, Fed. Rep. of Germany

[21] Appl. No.: 73,522

[22] Filed: Sep. 7, 1979

[30] Foreign Application Priority Data

Sep. 16, 1978 [DE] Fed. Rep. of Germany ....... 2840400

[51] Int. Cl.³ ................... H01L 23/42; H01L 23/44; H01L 23/46
[52] U.S. Cl. .................................. 357/79; 357/74; 357/75; 357/81; 357/68
[58] Field of Search ................. 357/74, 75, 79, 81, 357/68

[56] References Cited

U.S. PATENT DOCUMENTS

| | | | |
|---|---|---|---|
| 3,597,524 | 8/1971 | Schreiner | 357/79 |
| 3,673,308 | 6/1972 | Juchmann | 357/79 |
| 3,800,192 | 3/1974 | Eisele et al. | 357/81 |
| 3,886,586 | 5/1975 | Bahlinger | 357/79 |
| 3,893,162 | 7/1975 | Weidemann | 357/79 |
| 4,093,958 | 6/1978 | Riccio | 357/79 |
| 4,141,030 | 2/1979 | Eisele et al. | 357/79 |

Primary Examiner—Andrew J. James
Attorney, Agent, or Firm—Herbert L. Lerner; Laurence A. Greenberg

[57] ABSTRACT

Controlled power semiconductor component, having a disc-shaped silicon body with a surface on each side thereof, two insulated ductile electrodes each having surfaces on each side thereof, one of the surfaces of each of the ductile electrodes being in pressure contact with one of the surfaces of the silicon body, two pressure-contact discs each having an edge, and a surface on one side thereof in pressure contact with the other of the surfaces of the ductile electrodes, at least one control electrode connection disposed at a respective ductile electrode and contact disc on one of the sides of the silicon body, a bipartite annular cage divided along its diameter and having two polygonal recesses formed therein forming polygonal surfaces on the cage, and two inner flanges integral with the cage and bordering the recesses the flanges being disposed one above the other in axial direction of the silicon body, the polygonal surfaces on the cage formed by the recesses being tensionally connected to the edges of the contact discs.

9 Claims, 5 Drawing Figures

CONTROLLED POWER-SEMICONDUCTOR COMPONENT HAVING AN ANNULAR CAGE

The invention relates to a controlled power semiconductor component having a disc-shaped silicon body, whose main surfaces on each side are adjacent to a ductile electrode for making a pressure contact, a pressure contact disc of molybdenum or tungsten, and at least one control electrode connection provided by means of an insulated ductile electrode through a pressure contact disc. In particular, it deals with power-thyristors for currents up to several thousand Amps, maximal, periodic peak blocking voltages in the forward, as well as the reverse direction up to several thousand Volts, and for frequencies to at least 1500 Hz. However, the invention can also be applied to bi-directionally controlled power semiconductor components which can be switched from a low resistance state to a state with higher resistance, for example, Triacs. It can also be applied to controlled power-semiconductor elements which are integrated completely independent of each other, in a common semiconductor body, and which are provided with two control electrode connections, which are brought out at one side of the semiconductor element, or at different sides of the latter.

In a known pressure contact semiconductor component of the above-mentioned type, described in German Pat. DE-PS No. 20 39 806, the disc-shaped semiconductor body is disposed between two cup-shaped silver electrodes. The rims of the cups are turned away from the main surfaces (disc areas), and enclose the pressure-contact body. Edgewise, this assembly is enclosed by an insulating housing made of ceramic, for example.

This type of assembly is also known, for example, from Brown, Boveri Mitteilungen 5/75, page 225; German Published Non-Prosecuted Application DE-OS 22 46 423; and German Published Prosecuted Application DE-AS 24 05 930. From the last two mentioned publications, the assembly of the control electrode in the form of a central gate with insulated leads is also known as part of a typical controlled semiconductor component.

Naturally, this arrangement is only thermally and electrically conductive when pressure is applied by means of a conventional outside clamping device, such as described in BBC-Druckschrift No. D HS 70 467 D of 1977 "Cooling and Mounting of Power Semiconductor Component".

The sandwich-construction including the semiconductor body, two ductile silver electrodes, and two pressure-contact discs made of molybdenum, for example, is exactly centered with respect to a middle axis which is vertically oriented to the main surfaces, because of the necessary symmetrical pressure distribution. This exact centralized disposition must be maintained even if the assembly is delivered without the insulating case for further manufacturing purposes. Naturally, this condition must be also fulfilled for a semiconductor component which includes the insulating case. The semiconductor material and the pressure discs of molybdenum or tungsten exhibit highly different mass densities. Therefore, in the case of high acceleration, dislocation of these parts with respect to each other can occur. In particular, shifting due to acceleration from the side is critical, firstly, because the pressure symmetry (the symmetric pressure distribution) is destroyed, and secondly, because the control electrode is displaced.

It is accordingly an object of the invention to provide a controlled power-semiconductor component which overcomes the hereinaforementioned disadvantages of the heretofore known devices of this general type, to achieve protection against acceleration, and to provide vibration strength, to at least 5 times the acceleration due to gravity, in the direction of the central axis, and perpendicular thereto.

With the foregoing and other objects in view, there is provided, in accordance with the invention, a controlled power semiconductor component, comprising a disc-shaped silicon body having a surface on each side thereof, two insulated ductile electrodes each having surfaces on each side thereof, one of the surfaces of each of the ductile electrodes being in pressure contact with one of the surfaces of the silicon body, two pressure contact discs each having an edge, and a surface on one side thereof in pressure contact with the other of the surface of the ductile electrodes, at least one control electrode connection disposed at a respective ductile electrode and contact disc on one of the sides of the silicon body, a bipartite annular cage divided by a parting line along its diameter and having two polygonal recesses formed therein, forming polygonal surfaces on the cage, and two inner flanges integral with the cage and bordering the recesses, the flanges being disposed one above the other in axial direction of the silicon body which is perpendicular to the parting line, the polygonal surfaces on the cage formed by the recesses being tensionally connected to the edges of the contact discs.

In accordance with another feature of the invention, the contact discs are formed of molybdenum or tungsten.

With this "packaging" in the best case, a shock resistance (strength) up to 500 g can be reached. The position of the two pressure contact bodies to each other and with respect to the silicon-semiconductor body thereby remains stable. This is important for the position of the control electrode and the symmetrical pressure distribution, as described above.

In accordance with a further feature of the invention, the polygonal recesses are hexagonal and the cage is divided between two corners of the hexagonal recesses. In this manner, three diametrically opposed pairs of contact lines are formed which are uniformly distributed around the circumference, and parallel to the center axis.

In accordance with an added feature of the invention, the cage has an outer surface having a groove formed therein and a clamping ring disposed in the groove.

In accordance with an additional feature of the invention, the cage is formed of polysulfon. Polysulfon is a good insulating material, which is also light and stable, and has a favorable friction coefficient with the pressure-contact discs of molybdenum.

In accordance with yet another feature of the invention, there is provided an adhesive, such as silicon rubber, elastically securing the ductile electrodes to the silicon body. The adhesive permits differential thermal expansion between the silicon semiconductor body and the ductile electrodes during operation of the power-semiconductor component, and prevents shifting of the ductile electrodes.

In accordance with yet a further feature of the invention, the cage includes a measuring adapter portion integral therewith for fixing the silicon body for electrical measurements.

In accordance with yet an added feature of the invention, there is provided an insulating case surrounding the cage through which the measurements may be taken. Thereby the measurements can be taken outside of the insulating case, or also after insertion into the insulating case.

In accordance with yet an additional feature of the invention, there are provided pressure bodies disposed on the other side of the contact discs and metallic ring parts connected between the contact discs and the insulating case.

In accordance with a concomitant feature of the invention, the control electrode connection is disposed in a slot formed in one of the contact discs.

Other features which are considered as characteristics for the invention are set forth in the appended claims.

Although the invention is illustrated and described herein as embodied in controlled power-semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

The pressure-contact technique, which is known from German Pat. DE-PS 20 39 806 is used for the controlled semiconductor component and therefore this pressure-contact technique will not be described in detail herein.

Figure 1:
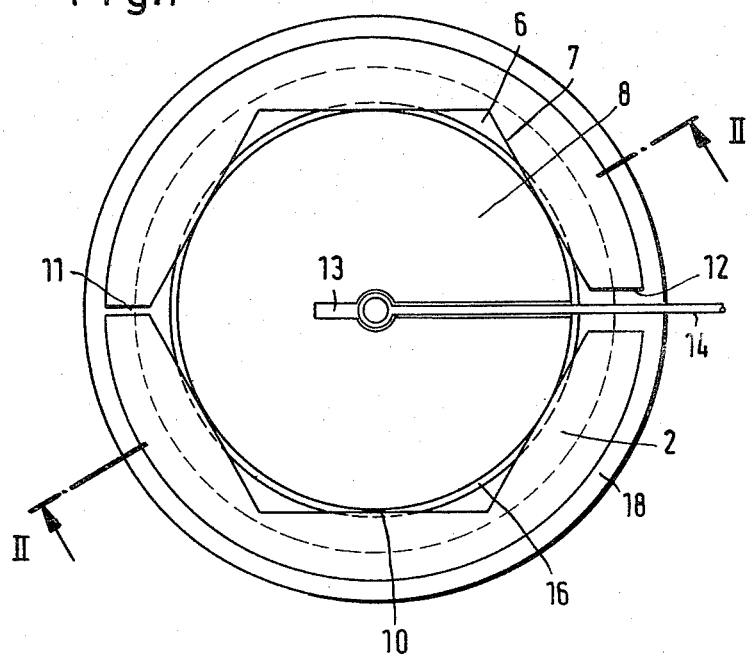
FIG. 1 is a diagrammatic top plan view of a controllable power-semiconductor element with a cage for acceleration protection.
Figure 2:
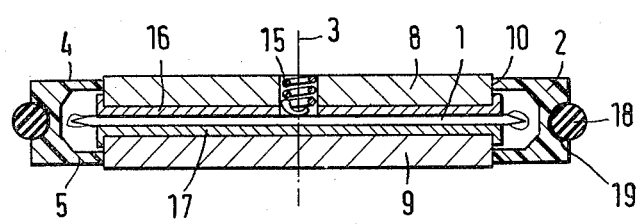
FIG. 2 is a vertical sectional view taken along the line II—II in FIG. 1, in the direction of the arrows.
Figure 4:
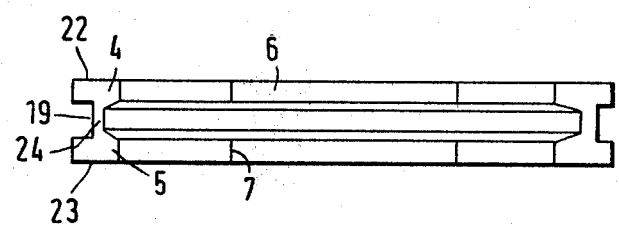
FIG. 4 is a vertical sectional view of the cage of FIG. 3, taken along the line IV—IV thereof, in the direction of the arrows.

Referring now as a whole to the figures of the drawing, there is seen a sandwich-assembly having an enclosed silicon body 1 surrounded by an annular cage 2 which is parted along its diameter to form two parts. The cage 2 has two polygonally and preferably hexagonally shaped recesses 6, bounded by inner flanges 4 and 5 as seen in FIGS. 2 and 4. The flanges 4 and 5 are disposed on top of each other with respect to the vertical center axis 3 as shown in FIG. 2. The surfaces 7 of the polygonal recesses 6 formed in the cage 2 contact the pressure contact discs 8 and 9, which are preferably made of molybdenum. An insulated ductile electrode 16, 17 is disposed between one surface of the silicon body 1 and one of the contact discs 8, 9, respectively. The ductile electrodes 16, 17 are in contact with both the silicon body 1 and the contact discs 8, 9 and extend beyond the edges of the latter as shown in FIGS. 1 and 2. The ductile electrodes may be secured to the silicon body with silicon rubber. For each contact disc 8 and 9, three diametrically opposed contact lines 10, which run parallel to the central axis 3 are thus formed. The cage 2 is parted in the zones of two diametrically opposed corners of the polygonally-shaped recesses 6; at separating gaps 11 and 12. The contact disc 8, in direction of the separating gaps 11 and 12, is provided with a slot 13 which extends from its rim beyond the geometrical center axis 3. Through this slot 13, the insulated control electrode-connection 14 is introduced from the side as shown in FIG. 1. The control electrode connection 14 can form a pressure contact by means of a spring 15, in a known manner and is constructed as a central gate in the embodiment according to FIG. 2. One of the two silver cups, known from the hereinafore mentioned German Pat. DE-PS No. 20 39 806, has, for this purpose, a perforation which matches with the slot 13 in the contact disc 8.

The sides of the two parts of the cage 2 are surrounded by an elastic clamp ring 18 which is inserted in a groove 19 formed in the outer surface of the cage 2. Other connection possibilities, for example, an interlocking joint in the zone of the separating gaps 11 and 12 of the cage 2 itself, can be used.

Figure 3:
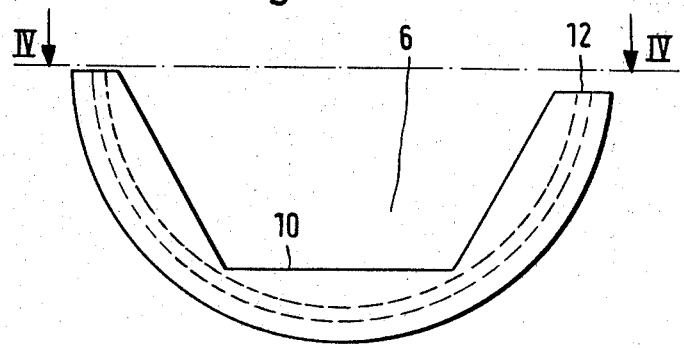
FIG. 3 is a diagrammatic top plan view of one part of the cage of the power-semiconductor element.

FIGS. 3 and 4 show a partial view of the same part of the cage 2. Each part is made of one piece, and includes a cover wall 22 and a bottom wall 23, which are connected to each other by a hollow-cylindrical middle portion 24.

Figure 5:
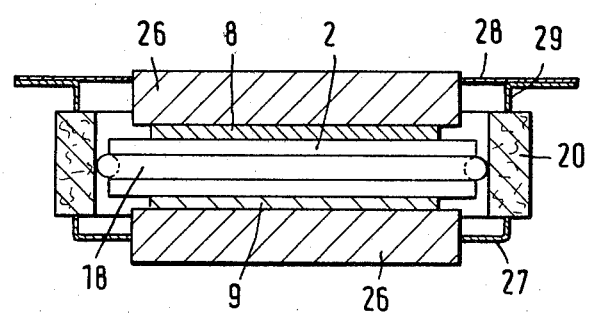
FIG. 5 is a diagrammatic vertical sectional view of the insulating case or housing containing the cage.

The complete assembly according to FIGS. 1 and 2 is inserted into an insulating case 20, which can be closed in a vacuum tight condition, as shown in FIG. 5. The pressure contact bodies 26 which are made of copper are directly adjacent to the molybdenum pressure contact discs 8 and 9. Furthermore, the pressure contact bodies 26 are connected to the ceramic insulating case 20 by metallic ring-parts 27, 28, 29.

The cage 2 is specifically constructed to allow connection to a portion thereof as a measuring adapter for fixing the silicon body for electrical measurements. Therefore, such measurements can be taken directly from the adapter-cage 2 or from within the insulating case 20.

There are claimed:

1. Controlled power semiconductor component, comprising a disc-shaped silicon body having a surface on each side thereof, two insulated ductile electrodes each having surfaces on each side thereof, one of said surfaces of each of said ductile electrodes being in pressure contact with one of said surfaces of said silicon body, two pressure-contact discs formed of one of the group consisting of molybdenum and tungsten each having an edge, and a surface on one side thereof in pressure contact with the other of said surfaces of said ductile electrodes, at least one control electrode connection being electrically insulated from and conducted through a respective ductile electrode and contact disc on one of said sides of said silicon body, a flat annular cage formed of insulating material for insertion in a housing centralizing said silicon body and contact discs, said cage having two circular disc-shaped flanges being disposed one above the other in axial direction of said silicon body and a hollow cylindrical middle portion connecting said flanges to each other forming a single piece, each of said flanges having internal polygonal recesses formed therein forming polygonal surfaces being tensionally connected to said edges of said contact discs, said cage being divided into two parts along the diameter thereof.

2. Semiconductor component according to claim 1, wherein said polygonal recesses are hexagonal and said cage is divided between two corners of said hexagonal recesses.

3. Semiconductor component according to claim 1, wherein said cage has an outer surface having a groove formed therein and a clamping ring disposed in said groove.

4. Semiconductor component according to claim 1, wherein said cage is formed of polysulfon.

5. Semiconductor component according to claim 1, wherein said ductile electrodes are cup-shaped and are pushed upside down over said contact discs, and including silicon rubber elastically securing said ductile electrodes to said silicon body.

6. Semiconductor component according to claim 1, wherein said cage is in the form of a measuring adapter for fixing said silicon body for electrical measurements.

7. Semiconductor component according to claim 7, including an insulating case surrounding said cage through which the measurements may be taken.

8. Semiconductor component according to claim 8, including pressure bodies disposed on the other side of said contact discs and metallic ring parts connected between said contact discs and said insulating case.

9. Semiconductor component according to claim 1 or 2, including engagement means for connecting said parts of said cage together.

* * * * *